United States Patent [19]

Jack et al.

[11] Patent Number: 4,927,773

[45] Date of Patent: May 22, 1990

[54] METHOD OF MINIMIZING IMPLANT-RELATED DAMAGE TO A GROUP II-VI SEMICONDUCTOR MATERIAL

[75] Inventors: Michael D. Jack, Goleta; George R. Chapman, Santa Barbara; Michael Ray, Goleta, all of Calif.

[73] Assignee: Santa Barbara Research Center, Goleta, Calif.

[21] Appl. No.: 361,452

[22] Filed: Jun. 5, 1989

[51] Int. Cl.$^5$ .................. H01L 21/385; H01L 21/425
[52] U.S. Cl. .......................................... 437/22; 437/31; 437/37; 437/150; 437/151; 437/162; 437/163; 437/164; 437/911; 437/987
[58] Field of Search ................ 437/22, 25, 28, 31, 437/160, 161, 162, 163, 164, 37, 911, 987, 185, 150, 151, 152; 148/DIG. 10

[56] References Cited

U.S. PATENT DOCUMENTS

| | | | |
|---|---|---|---|
| 4,389,768 | 6/1983 | Fowler | 437/161 |
| 4,431,460 | 2/1984 | Barson et al. | 437/31 |
| 4,617,724 | 10/1986 | Yokoyama et al. | 437/31 |
| 4,629,520 | 12/1986 | Ueno et al. | 437/31 |
| 4,824,798 | 4/1989 | Burnham et al. | 437/81 |

FOREIGN PATENT DOCUMENTS

| | | | |
|---|---|---|---|
| 0021133 | 1/1981 | European Pat. Off. | 437/31 |
| 0111085 | 6/1984 | European Pat. Off. | 437/22 |
| 2951504 | 6/1980 | Fed. Rep. of Germany | 437/31 |
| 3610157 | 10/1987 | Fed. Rep. of Germany | 437/22 |
| 59-129474 | 7/1984 | Japan | 437/22 |
| 63-43370 | 2/1988 | Japan | 437/31 |
| 2100927 | 1/1983 | United Kingdom. | |

*Primary Examiner*—Olik Chaudhuri
*Attorney, Agent, or Firm*—W. C. Schubert; W. K. Denson-Low

[57] ABSTRACT

A method of forming in a semiconductor material a region having a different chemical composition or a different concentration than a chemical composition or concentration of material surrounding the region. The method includes an initial step of providing a substantially single crystalline body of material, such as an epitaxial layer 10 of HgCdTe. Another step forms a cap layer 12 over a surface of the body, the layer having a thickness T. The cap layer 12 is comprised of a layer of polycrystalline material, such as CdTe, or is comprised of a layer of an organic material, an amorphous dielectric or a single-crystalline layer. A further step implants a selected chemical species through an upper surface of the cap, the species being implanted to a depth such that substantially no implant damage is sustained by the underlying body. In p-n junction formation the species is selected to form a region having an opposite type of electrical conductivity than the conductivity of the layer 10. A further step diffuses during a thermal anneal the implanted species from the cap layer down into the underlying layer to form a region therein having a different chemical composition or concentration than the chemical composition or concentration of the material surrounding the region. The method is also shown to be suitable for bipolar and JFET transistor fabrication in Group II-VI and Group III-V materials.

29 Claims, 3 Drawing Sheets

METHOD OF MINIMIZING IMPLANT-RELATED DAMAGE TO A GROUP II-VI SEMICONDUCTOR MATERIAL

FIELD OF THE INVENTION

This invention relates generally to semiconductor processing methodology and, in particular, relates to a method of introducing substitutional dopants into mercury-cadmium-telluride (HgCdTe) or other types of relatively fragile semiconductor material.

BACKGROUND OF THE INVENTION

Conventional ion implantation is not readily utilized to dope HgCdTe substitutionally as is the case for for Si and GaAs. Conventional implantation of almost any dopant species into relatively fragile HgCdTe results in the creation of n-type material due to implant induced lattice damage.

Another conventional method of introducing a dopant into HgCdTe for junction, contact or isolation formation relies on the introduction of a dopant into a melt and the subsequent growth of doped epitaxial layers. However, this technique has several inherent disadvantages including a difficulty in producing relatively small junctions and/or controlled junction depths and a difficulty in producing junctions in planar-type devices as opposed to mesa-type.

It is thus an object of the invention to provide a method of forming in a single crystal semiconductor material a region having a different chemical composition or concentration than a chemical composition or concentration of material surrounding the region.

It is another object of the invention to provide a processing method that produces both p-type and n-type high quality junctions within HgCdTe and similarly fragile materials such as HgCdSe and InSb.

It is another object of the invention to provide a processing method that readily produces compact, low noise junctions to create dense arrays of reduced capacitance photodiodes.

It is another object of the invention to provide a processing method that readily produces both p-type and n-type junctions within HgCdTe thereby facilitating the creation of compact and low noise HgCdTe transistors by sequentially formed p and n diffusions.

It is a still further object of the invention to provide a processing method that readily produces both p-type and n-type junctions within HgCdTe or similar fragile material and that employs a multi-step process including the formation of a cap layer over the HgCdTe or similar fragile material, the implantation into only the cap layer of the desired dopant species, and the subsequent rapid thermal diffusion of the dopant through the cap layer down to the HgCdTe surface.

SUMMARY OF THE INVENTION

The foregoing problems are overcome and the objects of the invention are realized by a method of forming in a semiconductor material a region that differs from a host material surrounding the region. The method includes an initial step of providing a body of material, such as an epitaxial layer of HgCdTe, having a p-type or an n-type of electrical conductivity. Another step of the method forms a cap layer such that the layer overlies a surface of the body, the layer having a thickness T. The cap layer may be comprised of a polycrystalline material, such as CdTe, or may be comprised of an organic material, an amorphous dielectric or a single-crystalline layer. A further step of the method implants a selected chemical species through an upper surface of the layer, the species being implanted to a depth such that substantially no implant damage is sustained by the underlying body of material. For the case of p-n junction formation the species is selected to form a region having an opposite type of electrical conductivity than the conductivity of the host body of material. In the case of contact or isolation formation the implant species is selected to form a region of enhanced electrical conductivity of the same type as the host body of material. A further step of the method diffuses, during a thermal anneal, the implanted species from the cap layer down into the underlying body of material to form a region therein having a different chemical composition or a different concentration of a chemical species than the chemical composition or concentration of the material surrounding the region. By example, the interface of the region and the body of HgCdTe forms a high quality, low noise p-n junction suitable for functioning as a radiation detector at cryogenic temperatures. Transistor structures are also fabricated by the method of the invention.

An exemplary implementation utilizes a polycrystalline cap layer of like electrochemical nature to an underlying host. By example, the host substrate is comprised of HgCdTe, HgCdSe or InSb and the cap layer is comprised of CdTe. The polycrystalline CdTe cap layer promotes the rapid diffusion of species implanted into the cap layer by migration along the grain boundaries of the cap layer.

BRIEF DESCRIPTION OF THE DRAWING

The above set forth and other features of the invention will be made more apparent in the ensuing Detailed Description of the Invention when read in conjunction with the attached Drawing, wherein.

DETAILED DESCRIPTION OF THE INVENTION

Figure 1A:
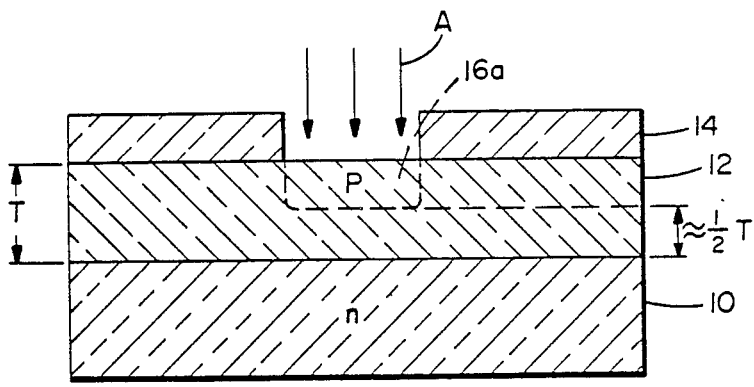
FIGS. 1a-1d show a cross-sectional view (not to scale) of a semiconductor device and illustrate various steps of a method of the invention.

Referring first to FIG. 1a there is provided a layer 10 that is comprised of Group II-VI, Group III-V or other semiconductor material. By example, layer 10 may be comprised of HgCdTe, HgCdSe or InSb. Layer 10 is typically provided as a layer that is epitaxially grown upon a surface of an underlying substrate (not shown) which may comprise CdZnTe, for example, if the layer 12 is comprised of HgCdTe.

A cap 12 comprised of, by example, a layer of polycrystalline material, such as CdTe, or comprised of a layer of an organic material, an amorphous dielectric or a single-crystalline layer is deposited onto the layer 10 by a suitable technique such as by thermal evaporation. One suitable organic material is comprised of doped polyacetylene. A suitable amorphous dielectric is comprised of photodecomposed $SiO_2$. A single crystalline cap layer may be comprised of an epitaxial layer of CdTe. That is, the cap 12 is preferably comprised of a wide bandgap material having a normally high undoped resistance. The cap 12 is deposited to a thickness (T) which, for the example of a HgCdTe layer 10 having a polycrystalline CdTe cap 12, may be within a range of approximately $10^2$ Angstroms to approximately $10^4$ Angstroms. As is also indicated in FIG. 1a an implant mask 14 is formed by conventional techniques, the mask material being comprised of photoresist or other suitable material. It is noted that although one opening is shown within the mask 14 that typically the mask will have hundreds or thousands of openings for patterning a dense one or two-dimensional array of photovoltaic radiation detectors. In other embodiments, to be described, the mask will have a number of openings for patterning a plurality of transistor structures. In still other embodiments the mask is patterned to provide n+/n or p+/p contacts or isolation.

Next an n-type or p-type dopant is selected and implanted, as indicated by the arrows A. The implant energy is chosen to locate the implant peak within the cap 12 sufficiently far away from the layer 10 to minimize damage to the layer 10. By example, the implant energy is chosen such that the implanted species penetrates to a depth of approximately $\frac{1}{2}$ or less of the thickness T of the cap layer 12. For the example of p-n junction formation, the layer 10 is n-type and the dopant is selected to be p-type and is implanted to a depth within a range of approximately $0.5 \times 10^2$ Angstroms to approximately $5 \times 10^3$ Angstroms, or $\frac{1}{2}$ T or less, to form the doped region 16a. For contact or isolation formation a dopant having the same electrical conductivity as the layer 10 is employed.

That is, and in accordance with the invention, the cap 12 thickness and the implant energy are selected such that residual implant damage does not significantly penetrate into the underlying material of the layer 10.

Figure 1B:
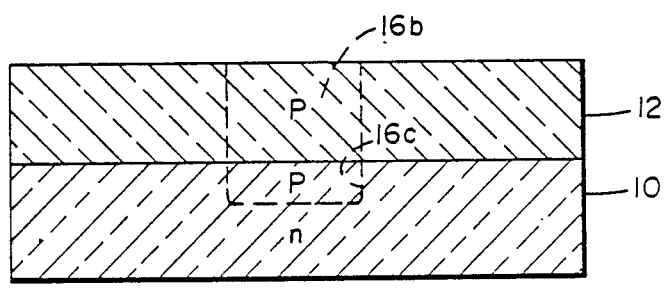

Referring to FIG. 1b the mask 16 is stripped and the cap 12 is retained. The two layers 10 and 12 are thereafter subjected to a first anneal in a clean ambient, such as within a vacuum furnace. This first anneal is a "drive-in" anneal wherein the diffusion time and temperature are selected to obtain the desired depth of diffusion into the layer 10. By example, a first anneal temperature of approximately 300° C. and time of approximately eight hours have been found to be satisfactory. Subsequent to the first anneal step a doped region 16b is found to extend from the upper surface of the cap 12 to the desired depth within the layer 10. A p-n junction 16c is thus created between the p-type and the adjacent n-type layer 10 material.

That is, after the thermal anneal the implanted species from the cap layer has diffused downwards into the underlying layer 10 to form a region therein that differs from the material surrounding the region. The region differs in having a different chemical composition and/or a different concentration of a chemical species than the chemical composition and/or concentration of the material surrounding the region.

It should be noted that during the first anneal that interdiffusion between the layer 10 and the cap 12 may occur, resulting in the formation of a region of graded composition between the layer 10 and the cap 12.

Figure 1C:
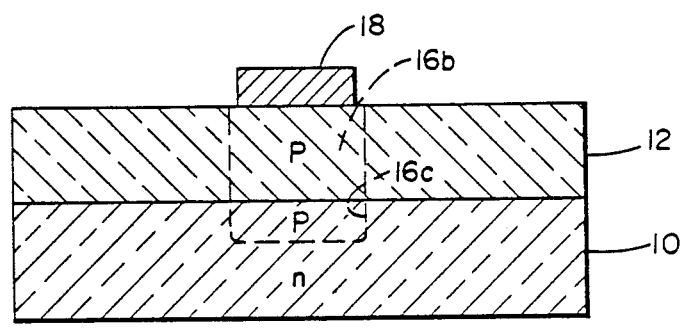
Figure 1D:
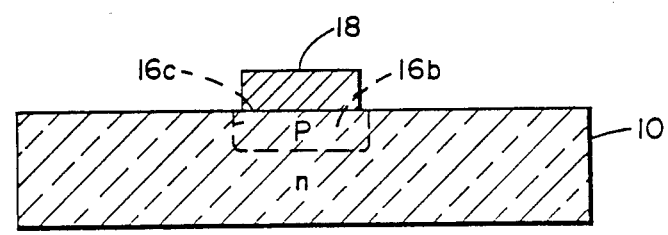

As can be seen in FIG. 1c the cap 12 may be retained to function as a low resistance, self-aligned junction contact. A conductor 18 is typically provided for electrically coupling to the junction via the doped cap 12 material. Alternatively, and as seen in FIG. 1d, the cap 12 is removed and the conductor 18 is applied directly to the layer 10. By example, a CdTe cap 12 may be removed with a specific CdTe etchant thereby leaving an underlying region of graded composition substantially intact. Alternatively, a non-specific etchant such as bromine ethylene glycol can be employed to strip the cap and the graded composition region.

A second anneal is preferably accomplished to restore the stoichiometry of the HgCdTe. By example, the second anneal is accomplished in a Hg-saturated atmosphere at a temperature of 250° C. for 16 hours.

If a polycrystalline material, such as CdTe, is employed for the cap 12 it has been observed that rapid diffusion of the implanted species along grain boundaries down to the underlying layer 10 surface occurs. In addition, the similar electrochemistry of CdTe and HgCdTe facilitates the formation of low resistance plugs of doped CdTe during the junction formation process.

Figure 3:
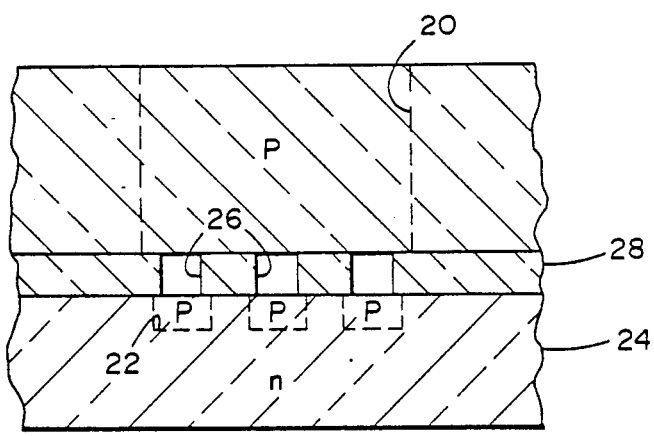
FIG. 3 is a cross-sectional view (not to scale) of a portion of a device illustrating steps of a variation of the method of the invention.

By example, and as shown in FIG. 3, the doped CdTe plug 20 can be utilized as an additional layer of interconnection with contact or junction 22 formation in a underlying layer 24 of HgCdTe being determined by vias 26 made through an underlying dielectric mask 28 material, such as silicon nitride. The mask 28 prevents regions of the circuit from experiencing unwanted diffusion during the thermal anneal step.

Further in accordance with the invention FIGS. 4a–4d show the utilization of the inventive method twice in succession to fabricate a HgCdTe bipolar transistor or junction FET.

Figure 4A:
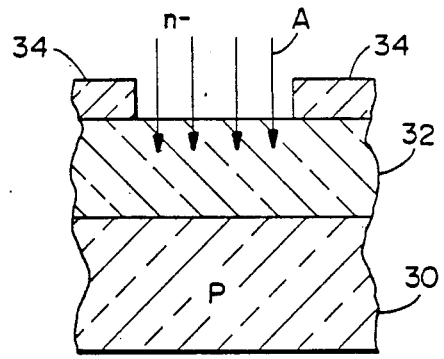
FIGS. 4a-4d show a cross-sectional view (not to scale) of a semiconductor device and illustrate steps of the method employed for transistor fabrication.

FIG. 4a illustrates a semiconductor p-type layer 30 overwhich a cap layer 32 is deposited. The layer 30 may be comprised of, by example, HgCdTe or InSb and the cap layer 32 may be comprised of polycrystalline CdTe. A first photoresist mask 34 is applied to delineate a transistor base or channel region. The mask 34 defines the surface area of the cap layer 32 implanted with, for this example, a species promoting electron conductivity in the underlying p-type layer 30. The energy of the implant is chosen to confine the peak of the implant within the cap layer 32 to minimize damage to the underlying layer 30.

Figure 4B:
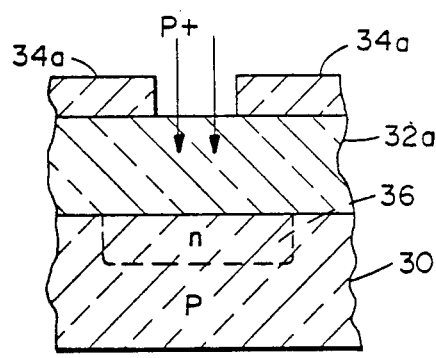

In FIG. 4b the first mask 34 is removed and the device subjected to a first heat treatment to drive the implanted species from the cap layer 32 into the p-type layer 30 beneath. This diffusion converts a portion of the underlying layer 30 to a region of different chemical composition, in this case providing an n-type region 36. At this point in the fabrication process two options are made possible depending on species type and diffusivity.

In option 1 the cap layer 32 is removed and another cap layer 32a is applied. A smaller area gate (JFET) or emitter (Bipolar transistor) region is delineated with a second mask 34a and the area is implanted with a species having an opposite type of conductivity from that of the first species. The implant energy is selected to minimize damage to underlying layer 30.

In option 2 the original cap layer 32 is retained and a higher dosage gate or emitter is implanted through the second mask 34a. It should be noted that the first heat treatment may be dispensed with and the original cap layer 32 implanted twice in succession, first with the species promoting electron conductivity and then again with the p-type species. The first mask 34 is stripped and the second mask 34a applied between the first and the second implant steps.

Figure 4C:
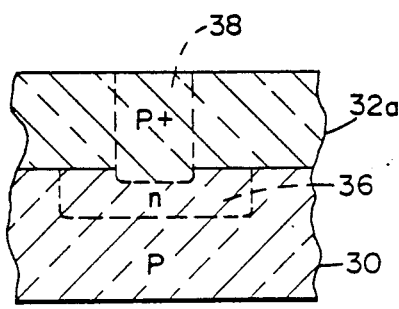

As can be seen in FIG. 4c during a subsequent second heat treatment both the n-type region 36 and the p+-type region 38 diffuse into the layer 30. For the method of option 2 during this single diffusion heat treatment a higher concentration of p impurity compensates the n.

Figure 4D:
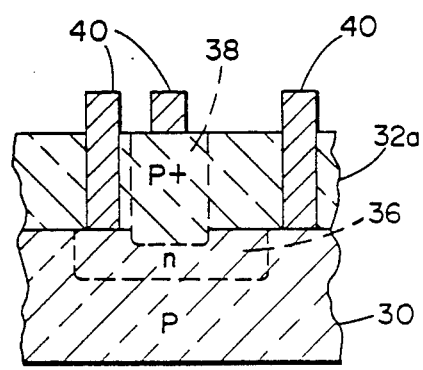

In FIG. 4d vias are formed through the cap layer 32a and metal contacts 40 are applied to the p+ region 38 (emitter or gate), n-type region 36 (channel or base) and to the p-type layer 30 (back-gate or collector).

Figure 2A:
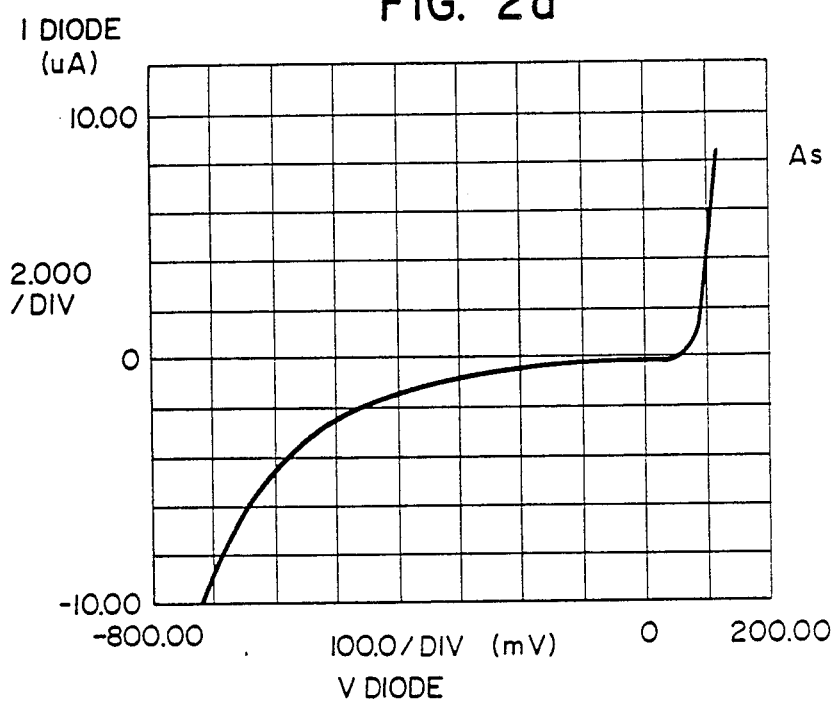
FIGS. 2a and 2b are performance characteristics (current versus voltage at 77K) for an arsenic doped device and an indium doped device, respectively, each of the devices being fabricated in accordance with the method of the invention.
Figure 2B:
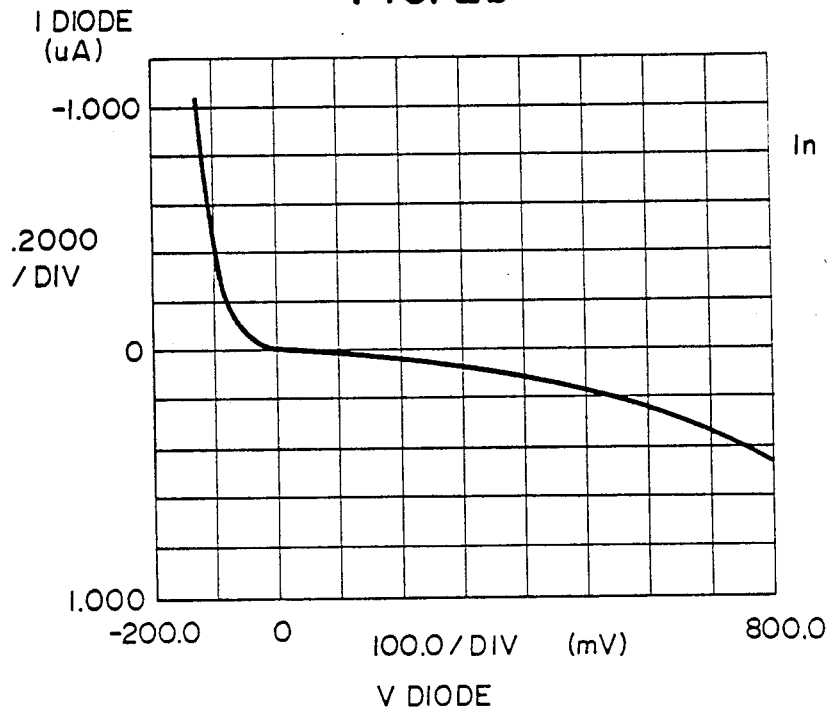

Current-voltage characteristics are shown in FIGS. 2a and 2b for p-on-n (arsenic implant species) and n-on-p (indium implant species) type junctions, respectively. Both junction types were formed by implantation into CdTe deposited onto a MWIR epitaxial HgCdTe layer grown on a CdZnTe substrate and show diode behavior with rectification in the proper polarity for each type. Low leakage currents below 10 nanoamps are achieved.

While the invention has been particularly shown and described with respect to preferred embodiments thereof, it will be understood by those skilled in the art that changes in form and details may be made therein without departing from the scope and spirit of the invention.

What is claimed is:

1. In a semiconductor material comprised of Group II–VI material, a method of forming a region therein that differs from the semiconductor material surrounding the region, comprising the steps of:
   providing a body comprised of Group II–VI semiconductor material;
   forming a cap layer having a lower surface that overlies a surface of the body;
   implanting a selected chemical species through an upper surface of the cap layer, the species being implanted to a depth such that an implant peak is located within the cap layer such that no significant implant damage or effects thereof are sustained by the underlying body; and
   diffusing the implanted species from the cap layer down into the underlying body to form a region therein that differs from the material of the body surrounding the region.

2. A method as set forth in claim 1 wherein the step of diffusing is accomplished by a first step of thermally annealing the body and cap layer.

3. A method as set forth in claim 1 wherein the step of implanting includes an initial step of forming a mask over the upper surface of the cap layer, the mask defining areas where the step of implanting occurs.

4. A method as set forth in claim 1 wherein the step of providing provides a substantially single crystalline body of semiconductor material.

5. A method as set forth in claim 1 wherein the step of providing includes an additional step of forming a mask over the upper surface of the layer, the mask having openings therethrough for defining regions where the diffusion into the body is to occur.

6. A method as set forth in claim 1 wherein the body is comprised of Group II–VI material having a first type of electrical conductivity, wherein the cap layer is comprised of material having a wider energy bandgap than an energy bandgap of the material of the body, and wherein the implanted chemical species is selected to provide the region with an opposite type of electrical conductivity or is selected to provide the region with an increased electrical conductivity of the first type.

7. A method as set forth in claim 2 and further comprising a step of performing a second anneal to reestablish a stoichiometry of the body.

8. A method as set forth in claim 1 wherein the cap layer has a thickness within a range of approximately 100 to approximately 10,000 Angstroms.

9. A method as set forth in claim 1 and further comprising a step of conductively coupling to the region from the top surface of the layer.

10. A method as set forth in claim 1 and further comprising the steps of:
    removing the layer; and
    conductively coupling to the region at the surface of the body.

11. A method as set forth in claim 1 wherein the step of forming a cap layer is accomplished by forming a layer selected from the group consisting of polycrystalline material, single crystalline material, organic material, amorphous dielectric material or combinations thereof.

12. A method as set forth in claim 1 wherein the step of forming a cap layer is accomplished by forming a layer that is electrochemically similar to the body of material.

13. In a semiconductor material, a method of forming a region therein that differs from the semiconductor material surrounding the region, comprising the steps of:
    providing a body comprised of semiconductor material;
    forming a cap layer having a lower surface that overlies a surface of the body;
    implanting a selected chemical species through an upper surface of the cap layer, the species being implanted to a depth such that no significant implant damage is sustained by the underlying body; and
    diffusing the implanted species from the cap layer down into the underlying body to form a region therein that differs from the material of the body surrounding the region; wherein the body is comprised of Group II–VI material having a first type of electrical conductivity, wherein the cap layer is comprised of material having a wider energy bandgap than an energy bandgap of the material of the body, wherein the implanted chemical species is selected to provide the region with an opposite type of electrical conductivity or is selected to provide the region with an increased electrical conductivity of the first type; and
    wherein the body is comprised of HgCdTe and wherein the cap layer is comprised of CdTe.

14. A method as set forth in claim 13 wherein the body is comprised of n-type HgCdTe and wherein the implanted chemical species is selected for forming a p-type region therein for creating a p-n junction within the HgCdTe.

15. A method as set forth in claim 13 wherein the body is comprised of p-type HgCdTe and wherein the implanted chemical species is selected for forming a n-type region therein for creating a p-n junction within the HgCdTe.

16. A method as set forth in claim 13 wherein the body is comprised of p-type or n-type HgCdTe and wherein the implanted chemical species is selected for forming a p+ or an n+ region, respectively, therein.

17. A method of forming a p-n junction within a substantially single crystalline layer comprised of a Group II-VI material, comprising the steps of:
providing a substantially single crystalline base layer comprised of Group II-VI material, the base layer having a first type of electrical conductivity;
forming a cap layer upon a surface of the base layer;
implanting a selected chemical species through an upper surface of the cap layer, the species being implanted to a depth such that an implant peak is located within the cap layer such that no significant implant-related damage or effects thereof are sustained by the underlying base layer; and
diffusing the implanted species from the cap layer down into the underlying base layer, the species being selected to form a region having a second type of electrical conductivity within the base layer for forming a p-n junction therein.

18. A method as set forth in claim 17 wherein the step of forming a cap layer is accomplished by forming a layer selected from the group consisting of polycrystalline material, single crystalline material, organic material, amorphous dielectric material or combinations thereof.

19. A method as set forth in claim 17 wherein the step of diffusing is accomplished during a first thermal anneal.

20. A method as set forth in claim 19 wherein the base layer is comprised of HgCdTe, the method including a step of reestablishing a stoichiometry of the HgCdTe base layer with a second anneal accomplished in a Hg-saturated atmosphere.

21. A method as set forth in claim 17 and further comprising a step of conductively coupling to the p-n junction from the top surface of the cap layer.

22. A method as set forth in claim 17 and further comprising the steps of:
removing the cap layer; and
conductively coupling to the p-n junction.

23. A method of forming a transistor structure within a region comprised of a Group II-VI or a Group III-V material, comprising the steps of:
providing a body of material comprised of Group II-VI or Group III-V material, the body of material having a first type of electrical conductivity;
forming a cap layer upon a surface of the body of material;
implanting a first selected chemical species through an upper surface of the cap layer, the species being implanted to a depth such that no significant implant-related damage is sustained by the underlying body of material;
diffusing the first implanted species from the cap layer down into the underlying body of material, the species being selected to form a first region having a second type of electrical conductivity within the body of material for forming a p-n junction therein;
implanting a second selected chemical species through an upper surface of the cap layer, the species being implanted to a depth such that no significant implant-related damage is sustained by the underlying body of material; and
diffusing the second implanted species from the cap layer down into the underlying body of material, the species being selected to form a second region having the first type of electrical conductivity for forming a p-n junction with the first region.

24. A method as set forth in claim 23 wherein the step of implanting a second selected chemical species occurs before the step of diffusing the first implanted species and wherein the step of diffusing the first implanted species and the step of diffusing the second implanted species occur substantially simultaneously.

25. A method as set forth in claim 23 wherein the step of diffusing the first implanted species includes the additional steps of:
removing the cap layer; and
forming a second cap layer upon the surface of the base layer.

26. A method as set forth in claim 23 and further including a step of conductively coupling to the base layer, to the first region and to the second region.

27. A method as set forth in claim 26 wherein the transistor structure is comprised of a bipolar npn transistor or a bipolar pnp transistor.

28. A method as set forth in claim 26 wherein the transistor structure is comprised of an n-channel JFET or a p-channel JFET.

29. A method as set forth in claim 23 wherein the cap layer is comprised of a material selected from a group consisting of a polycrystalline material, an organic material, an amorphous dielectric material, a single crystalline material or combinations thereof.

* * * * *